April 7, 1970 B. R. McAVOY 3,505,542

SURFACE WAVE PIEZOELECTRIC RESONATOR

Filed Feb. 28, 1968

WITNESSES
Theodore F. Wrobel
Lee P. Johns

INVENTOR
Bruce R. McAvoy
BY
Frederick Shapoe
ATTORNEY

United States Patent Office 3,505,542

Patented Apr. 7, 1970

3,505,542

SURFACE WAVE PIEZOELECTRIC RESONATOR

Bruce R. McAvoy, Pittsburgh, Pa., assignor to Westinghouse Electric Corporation, Pittsburgh, Pa., a corporation of Pennsylvania Filed Feb. 28, 1968, Ser. No. 708,824
Int. Cl. H01v 7/00
U.S. Cl. 310—9.6 9 Claims

ABSTRACT OF THE DISCLOSURE

A piezoelectric resonator including an annular body of piezoelectric material and at least one transducer for propagating and receiving surface wave energy in the annular body.

BACKGROUND OF THE INVENTION

Field of the invention

This invention relates to devices exhibiting acoustic resonance such as piezoelectric resonators employed in microminiature circuits.

Description of the prior art

Microelectronic solid state technology has been seeking a suitable frequency selective device or resonator for a multitude of purposes in microminiature circuits. Piezoelectric resonators, the most common of which is probably the quartz crystal, have long been used in conventional size circuitry applications. However, in the region of dimensions of the order of millimeters or less there is no generally applicable resonator. The high dielectric constant of a piezoelectric material, like cadmium sulfide (K=11), precludes its use for frequencies beyond about 500 megacycles because the electrode area necessary to excite body waves also results in a large shunt capacity across the device.

A body wave piezoelectric resonator must be acoustically isolated from its mounting in order not to dissipate the acoustic energy within the body. This isolation requires the deposition of two or more layers of fairly precise thickness beneath the piezoelectric film. For body waves the thickness of the film determines the resonant frequency and therefore the deposition of such a film must be carefully controlled. However, surface waves require no precise thickness control and no acoustical isolation from the substrate.

Although piezoelectric resonators or quartz or other materials are well known for use as tuning elements, they have not been wholly satisfactory when used with completely integrated circuits. For one reason previous work in this area has envisioned the surface wave resonator or delay line as a rectilinear device. One difficulty with such devices is insufficient energy storage in the surface wave or inadequate coupling into the surface mode of propagation. The resonant Q of such a device may suffer because of poorly controlled boundary conditions. A precise boundary angle is necessary to reflect the surface wave at an edge of the device. It is believed that the use of a periodic boundary condition will lessen somewhat the problem of depending upon reflection at an edge.

In electronic circuits, if a transducer is formed on top of a piezoelectric bar of rectangular cross section, a resonator is created because surface waves set up by the transducer reflect at the edges of the bar. Since the waves propagate only on top of the bar, the Q of the resonator will not depend on how the bottom surface of the bar is supported.

Associated with the foregoing are certain disadvantages involved with piezoelectric resonators of rectangular cross section. In accordance with this invention it has been found that those disadvantages may be overcome by providing a piezoelectric resonator of annular configuration. The advantages of an annular configuration among other things include (1) longer path length per surface area, (2) more compact interconnection scheme, and (3) more homogeneous deposition of a vapor deposited body.

Accordingly, it is the general object of this invention to provide a piezoelectric resonator which is particularly adapted for microelectronic applications.

It is another object of this invention to provide a piezoelectric resonator that is compatible with an integrated circuit in concept and technology.

Finally, it is an object of this invention to satisfy the foregoing objects and desiderata in a simple and expedient manner.

SUMMARY OF THE INVENTION

Generally, the piezoelectric resonator of the present invention comprises a piezoelectric body having an annular configuration, and transducer means on the surface of the body for propagating and receiving surface wave energy in the body in an annular path of travel equal to a whole integer of half a wave length of the surface wave.

BRIEF DESCRIPTION OF THE DRAWINGS

For a better understanding of the invention reference is made to the following description together with the accompanying drawings in which.

Similar numerals refer to similar parts throughout the several views of the drawings.

Figure 1:
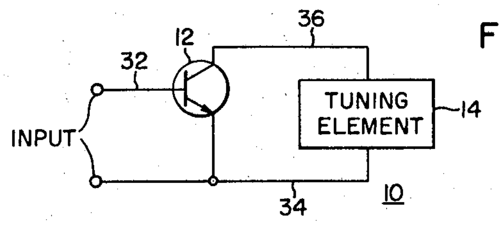
FIGURE 1 is a schematic diagram of electric circuit elements that may be joined in accordance with the principles of the present invention.

The diagram of FIG. 1 illustrates a portion of circuit 10 with elements intended to be integrated in a unitary structure. The circuit 10 includes a transistor amplifier 12 which is coupled to the tuning element 14. For clarity a conventional circuit for applying the necessary DC biases to the transistor amplifier 12 is not shown. The tuning element 14 provides frequency selectively in the amplification of the amplifier 12 as, for example, is desired in the intermediate frequency amplifier stages of a superheterodyne ratio receiver.

Figure 2:
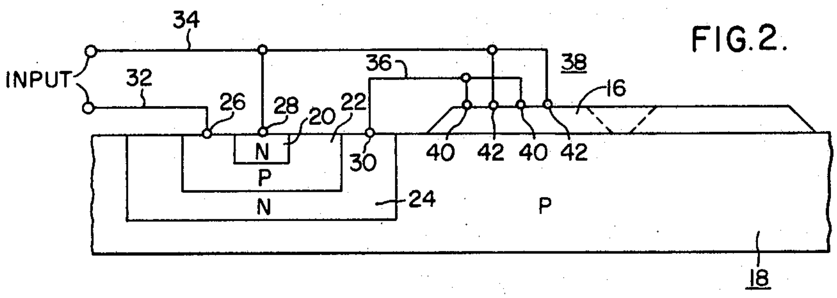
FIG. 2 is a sectional view of a fragmentary portion of an integrated circuit including a transistor amplifier that is electrically coupled to a piezoelectric resonator mounted on a substrate.

One form of the invention is illustrated in the structure of FIG. 2 in which the elements of FIG. 1 are physically integrated wherein a body or resonator 16 of piezoelectric material is mounted on a substrate 18 of a semiconductor integrated circuit. The resonator 16 functions as a tuning element for a transistor amplifier structure which includes an emitter region 20, a base region 22 and collector region 24 with ohmic contacts 26, 28 and 30 applied to the respective regions. Connection between the amplifier structure and the resonator 16 is provided by conductors 32, 34, and 36 as shown in FIGS. 1 and 2.

A surface wave is induced in the resonator 16 by a transducer generally indicated at 38 (FIG. 2) which includes at least one electrode having at least one and preferably two or more electrode elements 40 having instantaneously one polarity as well as at least one electrode having at least one and preferably two or more electrode elements 42 having instantaneously the opposite polarity.

Figure 3:
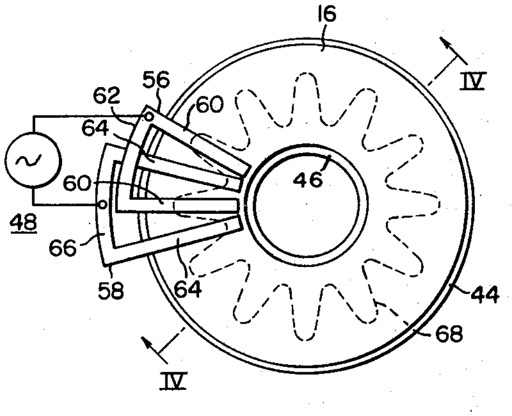
FIG. 3 is a schematic view of an annular piezoelectric body with one set of transducer electrodes mounted thereon.

A more particular structure of the annular resonator 16 and the transducer is illustrated in FIG. 3. The resonator 16 is an annular member composed of piezoelectric material such as quartz, Rochelle salt, cadmium sulfide, or lithium niobate. As is well known the piezoelectric effect is an interaction of mechanical stress-strain variables in a crystalline medium such as to produce an electric charge at the surface boundaries of the medium. Thus, compression of a crystal of quartz generates an electrostatic voltage across it, and conversely, application of an electric field causes the crystal to expand or contract in certain directions. The crystals are commonly manufactured to a thickness of approximately a half wavelength at the operating frequency which is the thickness for maximum efficiency. An upper frequency limit to the fabrication and mechanical bonding of transducers is established by practical considerations at about 100 mc./s. and the half wavelength thickness is about 25 microns.

The thin film resonator 16 is applied on the substrate 18 which is composed of semiconductor material such as P-type conductivity material. The resonator may be formed by deposition, such as by evaporation, of a layer of piezoelectric material, such as CdS, on the substrate.

Figure 4:
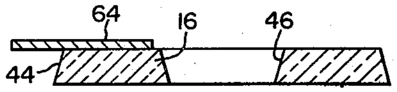
FIG. 4 is a vertical sectional view taken on the line IV—IV of FIG. 3.
Figure 6:
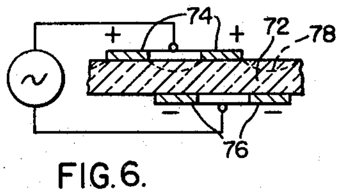
FIG. 6 is a fragmentary sectional view through a piezoelectric body showing transducer electrodes of one polarity mounted on one side of the body and electrodes of the opposite polarity mounted on the opposite side of the body.

The radius of the resonator 16 is dependent upon the mean circumference which is the annular path of travel of the surface wave energy and which is approximately equal to a whole integer of half a wavelength of the surface wave energy induced into the resonator. Moreover, an outer peripheral portion 44 of the resonator is bevelled (FIG. 4) to improve reflection of the surface waves and thereby minimize energy leakage from the resonator. The resonator may have the general shape of a truncated cone with a center hole 46. The efficiency of the resonator is definitely improved by provision of surface wave reflecting means such as the bevelled periphery 14 of the resonator 16 as generally disclosed in Soviet Physics, volume 3, pp. 304–306, 1958.

Figure 5:
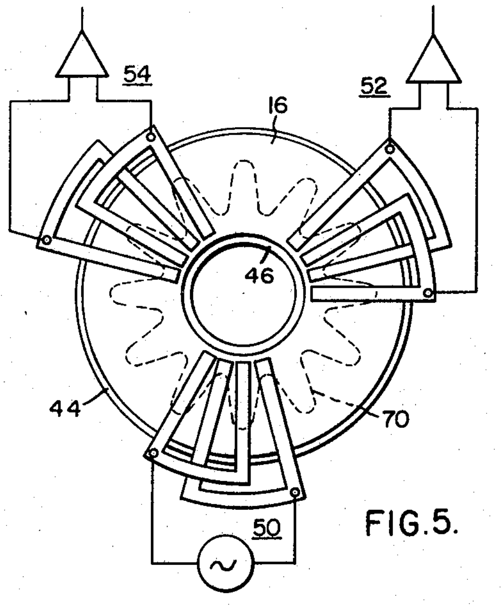
FIG. 5 is a schematic view of an annular piezoelectric body with three sets of transducer electrodes mounted thereon.

As shown in FIGS. 3 and 5 means for transducing or transmitting energy into the resonator 16 is provided on one surface thereof. The transducer means may include a single set of electrodes 48 (FIG. 3), or a plurality of sets such as three sets of electrodes 50, 52, and 54 (FIG. 5). Each set 48, 50, 52, 54 of electrodes may include a plurality of electrode elements or digits. For simplicity each electrode is shown with two elements of opposite polarity.

In FIG. 3 the set 48 of electrodes includes a pair of electrodes 56 and 58 of opposite polarity. The electrode 56 includes a pair of elements 60 which are interconnected by a strap 62 which in turn is connected to a source of AC current. Likewise, the electrode 58 includes a pair of elements 64 which are interconnected by a strap 66 that is connected to the source of AC current as shown in FIG. 3.

The elements 60 and 64 are interdigitally disposed on one side of the resonator 16 and extend substantially radially across the surface thereof. The elements 60 and 64 are selectively spaced so as to preferentially induce and maintain the surface wave 68.

The elements 60 and 64 may be applied in any conventional manner for mounting transducers or resonators of other configuration, such as by etching a metal comb or by vapor depositing. For example, the transducer elements and straps may be formed by evaporating a thin film of a metallic conductor such as aluminum, copper, or nickel. Conducting alloys may also be used.

Another form of the invention is shown in FIG. 5 in which the three sets of electrodes 50, 52, and 54 similar to electrode 48 are disposed at substantially equally spaced intervals. With such a construction the electrodes 50 may be an input with the electrodes 52 and 54 being used as phase taps for applications where phase discrimination is important, i.e., color television.

In the form of the invention shown in FIG. 5 excitation at the input transducer 50 has a given phase and amplitude. By the time the surface wave reaches the electrode 52 it will have been shifted in phase by 120°. If for example, it is supposed that an excitation equal to the given phase and amplitude is introduced at electrode 52 except that its phase has been shifted 180°, a destructive interference occurs at the electrodes 52. If it is assumed that a wave 70 travels clockwise from the electrode 50 several cycles are required to establish a standing wave in the resonator 16 and the electrode 52 will destructively interfere with running waves traveling both clockwise and counterclockwise. No output occurs at electrode 54. Hence, in computer language there is a binary zero at electrode 54 while there is a binary one at electrode 50 with a binary one antiphase at electrode 52.

If the control input at electrode 52 were in phase with that of electrode 50, however, then an output would occur at the electrode 54. Thus, the circuit shown in FIG. 5 may be used to perform three level logic in which a logic one indicates the presence of a sine wave, a logic zero indicates no sine wave, and a "conjugate one" indicating the presence of a sine wave but antiphase to the reference. This type of circuit can afford considerable economy in number of components to perform a specific logic operation. Since each is of the order of millimeters in diameter at most, a highly compact and complex logic system can be fabricated by means of interconnecting devices like the one described. The number of phase taps is, of course, not limited but may be as many as the intensity of the surface wave will allow.

Accordingly, the device of the present invention provides a piezoelectric resonator having an annular configuration having the advantages of providing (1) a longer path length per surface area, (2) a compact interconnection scheme, and (3) more homogeneous deposition of a vapor deposited body, i.e., extending over a smaller area with less susceptibility to material irregularity such as structural defects, inhomogeneity, and polycrystalline structure.

It is understood that the above specification and drawings are merely exemplary and not in limitation of the invention.

What is claimed is:

1. A piezoelectric resonator for utilizing surface wave energy, comprising a body of piezoelectric material having an annular configuration and surface wave reflecting means at the periphery of the body, and transducer means on the surface of the body for propagating surface energy circumferentially in the body in an annular path of travel equal to a whole integer of half a wavelength of the surface wave energy.

2. The resonator construction of claim 1 in which the annular body of piezoelectric material has a mean circumference substantially equal to a whole integer of half a wavelength of the surface wave energy.

3. The resonator construction of claim 1 in which the peripheral surface of the body has the configuration of a truncated cone.

4. The resonator construction of claim 1 in which the transducer mean sincludes at least one electrode having a plurality of electrode elements.

5. The resonator construction of claim 1 in which the transducer means includes electrodes mounted on one surface of the body.

6. The resonator construction of claim 1 in which the transducer means includes electrode elements of opposite instantaneous polarity interdigitally disposed.

7. The resonator construction of claim 6 in which the electrode elements of one instantaneous polarity for one electrode are disposed on one side of the body and the electrode elements of another instantaneous polarity for the one electrode are disposed on the other side and staggered with respect to the elements of said one instantaneous polarity.

8. The resonator construction of claim 1 in which the transducer means includes a plurality of electrodes circumferentially spaced around the annular body by distances that correspond with the phase of the surface wave.

9. The resonator construction of claim 1 wherein the body is solidly mounted on a substrate.

References Cited

UNITED STATES PATENTS

| | | | |
|---|---|---|---|
| 3,414,832 | 12/1968 | Newell | 317—235 |
| 3,209,178 | 9/1965 | Koneval | 310—98 |
| 2,912,854 | 11/1959 | Schubring | 310—8.1 |

J D MILLER, Primary Examiner

U.S. Cl. X.R.

310—8.5; 317—235